(12) United States Patent
You (10) Patent No.: US 7,031,216 B2
(45) Date of Patent: Apr. 18, 2006

(54) REFRESH CONTROLLER WITH LOW PEAK CURRENT

(75) Inventor: Min Young You, Cheongjoo-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/874,568

(22) Filed: Jun. 22, 2004

(65) Prior Publication Data

US 2005/0128847 A1 Jun. 16, 2005

(30) Foreign Application Priority Data

Dec. 15, 2003 (KR) ...................... 10-2003-0091675

(51) Int. Cl.
*G11C 7/10* (2006.01)
*G11C 8/00* (2006.01)
*G11C 21/02* (2006.01)
*G11C 17/00* (2006.01)

(52) U.S. Cl. ............ 365/222; 365/189.05; 365/230.08; 365/230.03; 365/76; 365/93; 365/194

(58) Field of Classification Search ................ 365/222, 365/194, 230.03, 189.02, 230.08, 189.05, 365/76, 93

See application file for complete search history.

(56) References Cited

U.S. PATENT DOCUMENTS

| 6,333,886 | B1 * | 12/2001 | Cho et al. | 365/222 |
| 6,518,595 | B1 * | 2/2003 | Lee | 257/66 |
| 6,621,753 | B1 * | 9/2003 | Fujimoto et al. | 365/222 |
| 6,847,572 | B1 * | 1/2005 | Lee et al. | 365/222 |

* cited by examiner

*Primary Examiner*—George Eckert
*Assistant Examiner*—Anthan Tran
(74) *Attorney, Agent, or Firm*—Marshall, Gerstein & Borun LLP (57) ABSTRACT

The disclosure relates to a memory such as a DRAM (dynamic random access memory), specifically to a refresh controller embedded in a memory. The refresh controller according to the present invention lowers the levels of peak currents by differentiating active times of a first bank enable signal and a second bank enable signal. The present invention has an advantage that there is no problem of substantially reducing a refresh prosecution time for a second portion because a delayed refresh enable signal is being disabled even while the second bank enable signal is being enabled.

13 Claims, 5 Drawing Sheets

REFRESH CONTROLLER WITH LOW PEAK CURRENT

This application relies for priority upon Korean Patent Application No. 2003-91675 filed on Dec. 15, 2003, the contents of which are herein incorporated by reference in their entirety.

1. Field of the Invention

The present invention relates to a memory such as a DRAM (dynamic random access memory), specifically to a refresh controller embedded in a memory.

2. Background of the Invention

A RAM needs a periodic refresh operation to retain data stored therein. That is, a capacitor located in a memory cell must be charged in periodic cycles.

In a conventional way for refreshing a bank including 8000 word lines, one word line assigned by one X-address has been put into the refresh operation. Recently, as they are normally using a bank including 16000 word lines, a refresh operation is carried out with two word lines when one X-address is provided thereto. In detail, a bank is divided into two portions of first and second portions, each of which includes 8000 word lines, and thereby the refresh operation is carried out for one word line of the first portion and the other word line of the second portion when one X-address is provided thereto. While this, there is a problem that a peak current raised from the refresh operation is magnified twice because the two word lines are contemporaneously activated during the refresh operation.

SUMMARY OF THE INVENTION

Therefore, the present invention is directed to solve the aforementioned problem, providing a refresh controller preventing a peak current from rising twice even when a refresh operation is performed with two word lines for one X-address.

In accordance with an embodiment of the present invention, there is provided a refresh controller comprising a first element, a second element, and a third element, and outputting a first bank enable signal, a second bank enable signal, and a delayed refresh enable signal in response to a bank enable signal and a refresh enable signal, wherein: the first element outputs the bank enable signal with a delay when an output signal of the third element is being active, while outputs the bank enable signal when the output signal of the third element is being inactive; the second element outputs a signal having an enable state when the bank enable signal or an output signal of the first element is being active, while outputs the signal having an disable state when the bank enable signal and the output signal of the first element are being inactive; the third element outputs the refresh enable signal when an output signal of the second element is being inactive, while maintains a previous output when the output signal of the second element is being active; and the first bank enable signal is the bank enable signal, the output signal of the first element is the second bank enable signal, and the output signal of the third element is the delayed refresh enable signal.

In accordance with another embodiment of the present invention, there is provided a refresh controller comprising a first element, a second element, and a third element, and outputting a first bank enable signal, a second bank enable signal, and a delayed refresh enable signal in response to a bank enable signal and a refresh enable signal, wherein: the first element outputs the bank enable signal with a delay when an output signal of the third element is being active, while outputs the bank enable signal when the output signal of the third element is being inactive; the second element turns an output thereof signal to an enable state when the bank enable signal turns to an active state, while turns the output signal to a disable state after a predetermined time when an output signal of the first element changes to an disable state; the third element outputs the refresh enable signal when the output signal of the second element is being inactive, while maintains a previous output when the output signal of the second element is being active; and the first bank enable signal is the bank enable signal, the output signal of the first element is the second bank enable signal, and the output signal of the third element is the delayed refresh enable signal.

In accordance with further another embodiment of the present invention, there is provided a refresh controller comprising a first element, a second element, a third element, and a fourth element and outputting a first bank enable signal, a second bank enable signal, and a delayed refresh enable signal in response to a bank enable signal and a refresh enable signal, wherein: the first element outputs the bank enable signal with an increased drivability; the second element outputs the bank enable signal with a delay when an output signal of the fourth element is being active, while outputs the bank enable signal with an increased drivability when the output signal of the fourth element is being inactive; the third element outputs a signal having an enable state when an output signal of the first element or an output signal of the second element is being active, while outputs the signal having disable state when the output signal of the first element and the output signal of the second element is being inactive; the fourth element outputs the refresh enable signal when the output signal of the third element is being inactive, while maintains a previous output when the output signal of the third element is being active; and the output signal of the first element is the bank enable signal, the output signal of the second element is the second bank enable signal, and the output signal of the four element is the delayed refresh enable signal.

In accordance with still further another embodiment of the present invention, there is provided a refresh controller comprising a first element, a second element, a third element, and a fourth element and outputting a first bank enable signal, a second bank enable signal, and a delayed refresh enable signal in response to a bank enable signal and a refresh enable signal, wherein: the first element outputs the bank enable signal with an increased drivability; the second element outputs the bank enable signal with a delay when an output signal of the fourth element is being active, while outputs the bank enable signal with an increased drivability when the output signal of the fourth element is being inactive; the third element turns an output signal to an enable state when an output signal of the first element turns to an active state, while turns an output signal to a disable state after a predetermined time when an output signal of the second element changes to an disable state; the fourth element outputs the refresh enable signal when the output signal of the third element is being inactive, while maintains a previous output when the output signal of the third element is being active; and the output signal of the first element is the bank enable signal, the output signal of the second element is the second bank enable signal, and the output signal of the four element is the delayed refresh enable signal.

BRIEF DESCRIPTION OF THE DRAWINGS

A more complete understanding of the present invention may be had by reference to the following description when taken in conjunction with the accompanying drawings in which.

DESCRIPTION OF THE PREFERRED EMBODIMENT

Referring now to the drawings, wherein like or similar elements are designated with identical reference numerals throughout the several views, and wherein various elements depicted are not necessarily drawn to scale.

Figure 1:
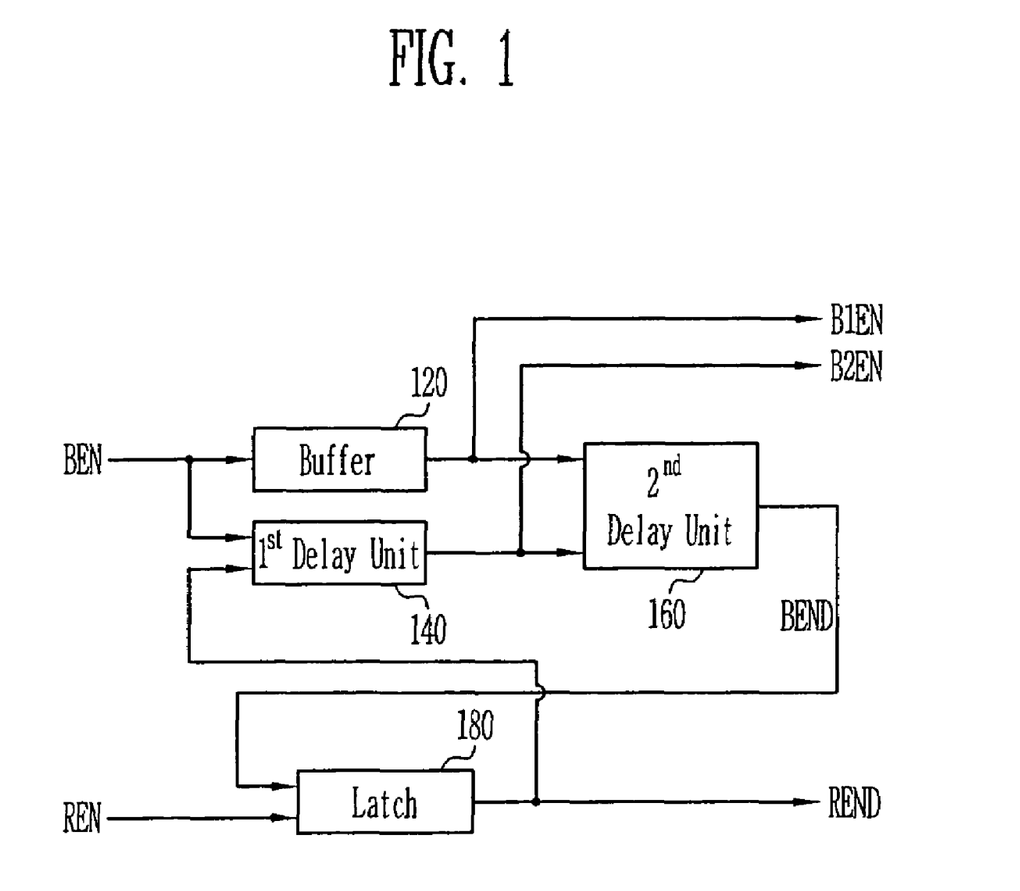
FIG. 1 is a block diagram of a refresh controller according to an embodiment of the present invention.
Figure 2:
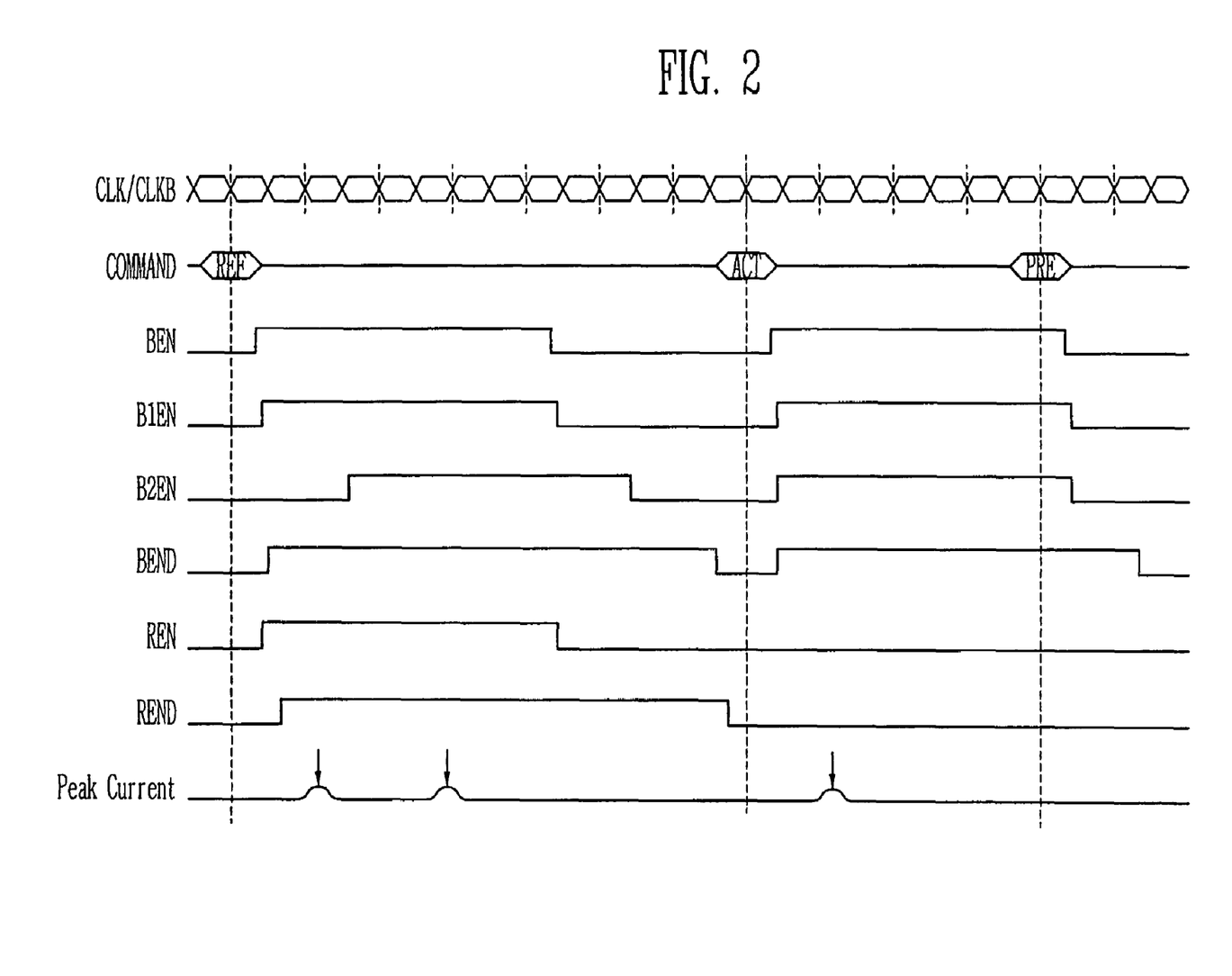
FIG. 2 is a timing diagram of signals operable in the refresh controller according to the embodiment of the present invention.

FIG. 1 is a block diagram of a refresh controller according to an embodiment of the present invention, and FIG. 2 is a timing diagram of signals operable in the refresh controller according to the embodiment of the present invention.

In FIG. 1, the refresh controller receives a bank enable signal BEN and a refresh enable signal REN, and then outputs a first bank enable signal B1EN, a second bank enable signal B2EN and a delayed refresh enable signal REND to a memory bank (not shown).

The bank enable signal BEN is a signal to enable a specific memory bank, the first bank enable signal B1EN is a signal to enable a first portion as a partial word lines arranged in the bank, and the second bank enable signal B2EN is a signal to enable a second portion as the rest of the word lines arranged in the bank. As an example, assuming that a bank is composed of 16000 word lines, the first bank enable signal B1EN activates 8000 word lines while the second bank enable signal B2EN activates the rest 8000 word lines. The refresh enable signal REN is a signal to enable an refresh operation mode and the delayed refresh enable signal REND is a signal delay from the refresh enable signal REN.

When the first bank enable signal B1EN and the delayed refresh enable signal REND are being active, the word lines of the first portion are driven into the refresh operation. When the second bank enable signal B2EN and the delayed refresh enable signal REND are being active, the word lines of the second portion are driven into the refresh operation.

As illustrated in FIG. 1, the refresh controller includes a buffer 120, a first delay unit 140, a second delay unit 160, and a latch 180.

The buffer 120 receives the bank enable signal BEN and then outputs the first bank enable signal B1EN. The buffer 120 outputs its output with increased drivability from its input. The buffer 120 may not be included in the refresh controller if the bank enable signal BEN has a sufficient drivability. FIG. 2 shows the states of the bank enable signal BEN and the first bank enable signal B1EN in the condition of that an enable state is represented by logic "1" while a disable state is by logic "0".

The first delay unit 140 outputs the second bank enable signal B2EN in response to the bank enable signal BEN and the delayed refresh enable signal REND. The first delay unit 140 outputs the bank enable signal BEN after delaying if the delayed refresh enable signal REND is being active, while outputs the bank enable signal BEN with an increased drivability if the delayed refresh enable signal REND is being inactive. FIG. 2 also shows the states of the bank enable signal BEN, the delayed refresh enable signal REND and the first bank enable signal B1EN in the condition of that an enable state is represented by logic "1" while a disable state is by logic "0".

The second delay unit 160 outputs the delayed bank enable signal BEND in response to the first bank enable signal B1EN and the second bank enable signal B2EN. The delayed bank enable signal BEND becomes active when the first bank enable signal B1EN is being active, while becomes inactive directly or inactive after a predetermined time. FIG. 2 also shows the states of the first bank enable signal B1EN, the second bank enable signal B2EN, and the delayed bank enable signal BEND, when the delayed bank enable signal BEND is inactive after lapsing a predetermined time from an inactivation of the second bank enable signal B2EN, in the condition of that an enable state is represented by logic "1" while a disable state is by logic "0".

The latch 180 outputs the delayed refresh enable signal REND in response to the delayed bank enable signal BEND and the refresh enable signal REN. The latch 180 outputs the refresh enable signal REN if the delayed bank enable signal BEND is being inactive, while maintains its pervious output if the delayed bank enable signal BEND is being active. FIG. 2 also shows the states of the bank enable signal BEN, the refresh enable signal REN and the delayed refresh enable signal REND in the condition of that an enable state is represented by logic "1" while a disable state is by logic "0".

As shown in FIG. 2, the refresh controller by the first embodiment of the present invention reduces the level of the peak current by differentiating activation times of the first bank enable signal B1EN and the second bank enable signal B2EN. Further, the delayed refresh enable signal REND is generated from the first bank enable signal B1EN and the second bank enable signal B2EN as well as from the refresh enable signal REN, so that the delay refresh enable signal REND is being active at least when either the first bank enable signal B1EN or the second bank enable signal B2EN is being active. Thus, it is possible to execute an exact refresh operation. In other words, there is no fact of reducing a refresh time for the second portion of the bank because of the problem such that the delayed refresh enable signal REND is being inactive even when the second bank enable signal B2EN is being active.

Now referring to FIGS. 3 to 10, it will be described about the pratical implementations the elements provided to the refresh controller according to the embodiment of the present invention.

Figure 3:
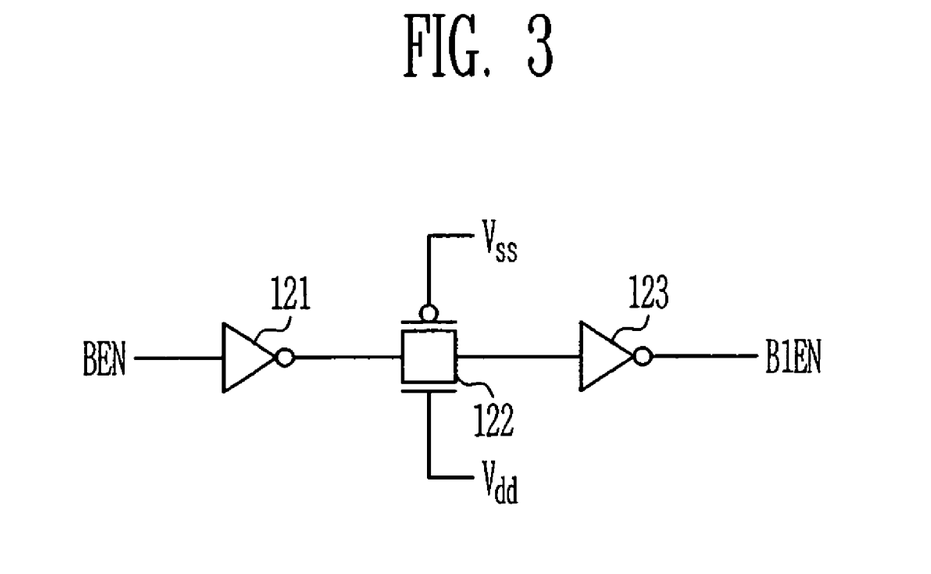
FIG. 3 is a circuit diagram illustrating an embodiment of a buffer.

FIG. 3 is a circuit diagram illustrating an embodiment of the buffer. In FIG. 3, the buffer receives the bank enable signal BEN and then outputs the first bank enable signal B1EN. The buffer includes two inverters 121 and 123 and one transfer gate 122. The transfer gate 122 is formed of a PMOS transistor and an NMOS transistor. A source/drain of the PMOS transistor is connected to a source/drain of the NMOS transistor to act as a first source/drain of the transfer gate 122, while the other source/drain of the PMOS transistor is connected to the other source/drain of the NMOS transistor to act as a second source/drain of the transfer gate 122. A PMOS gate of the transfer gate 122 is coupled to a low voltage source Vss, while an NMOS gate of the transfer gate 122 is coupled to a high voltage source Vdd, which maintains the transfer gate in a normal ON state. The reason for setting the transfer gate in a normal ON state is to accord a delay time thereof with that of the first delay unit described hereinafter. The two inverters 121 and 123 increases the output drivability.

Figure 4:
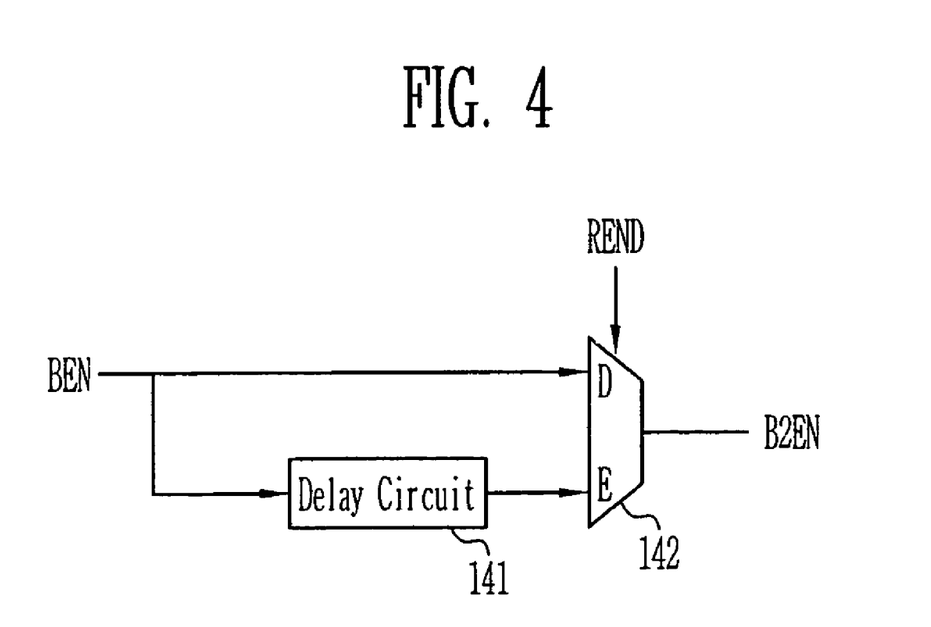
FIG. 4 is a circuit diagram illustrating an embodiment of a first delay unit.
Figure 5:
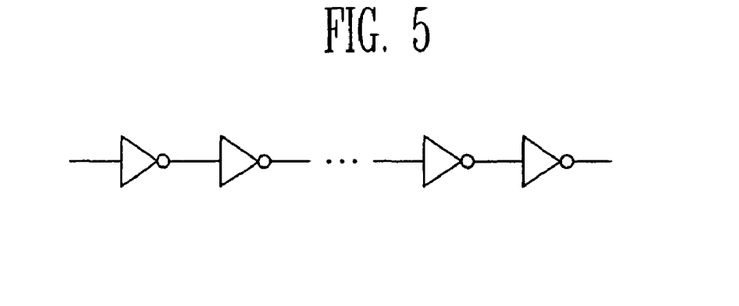
FIG. 5 is a circuit diagram illustrating an embodiment of a delay circuit.

FIG. 4 illustrates an embodiment of the first delay unit. In FIG. 4, the first delay unit outputs the second bank enable signal B2EN in response to the bank enable signal BEN and the delayed refresh enable signal REND. The first delay unit is formed of a delay circuit 141 and a multiplxer 142. FIG. 5 illustrates an embodiment of a delay circuit. The delay circuit of FIG. 5 is composed of even number of inverters. The multiplexer of FIG. 4 outputs a signal provided from the delay circuit 141 when the delayed refresh enable signal REND is being active, while outputs the bank enable signal BEN when the delayed refresh enable signal REND is being inactive.

Figure 6:
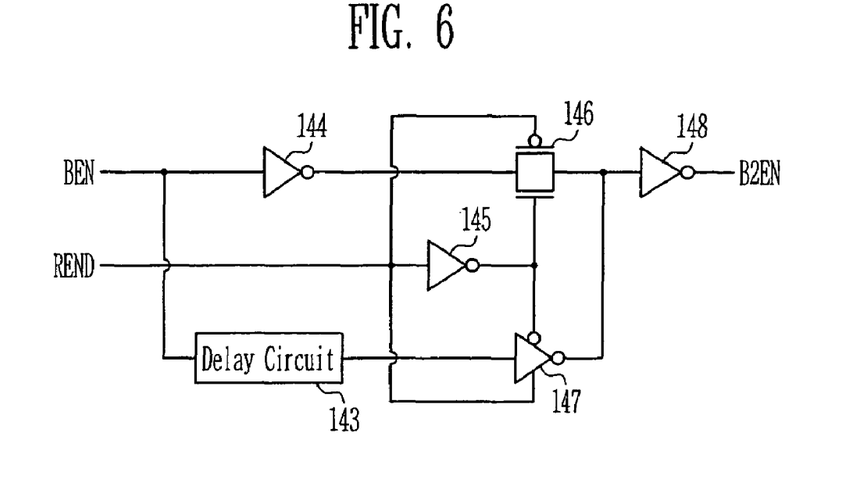
FIG. 6 is a circuit diagram illustrating another embodiment of the first delay unit.
Figure 7:
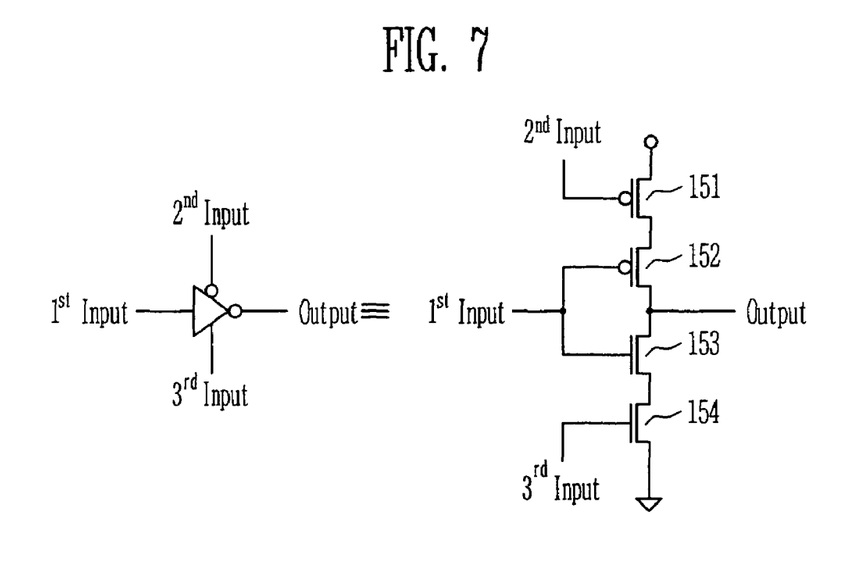
FIG. 7 is a circuit diagram illustrating an embodiment of a clocked inverter.

FIG. 6 illustrates another embodiment of the first delay unit in the condition of that an enable state is logic "1". In FIG. 6, the first delay unit is formed of three inverters, 144, 145, and 148, a delay circuit 143, a transfer gate 146, and a clocked inverter 147. An embodiment of a clocked inverter is illustrated in FIG. 7. In FIG. 7, the clocked inverter is composed of two PMOS transistors, 151 and 152, and two NMOS transistors 153 and 154. The clocked inverter generates an output inversed from a first input when a second input is logic "0" and a third input is logic "1", while outputs a high impedance output when the second input is logic "1" and the third input is logic "0". In FIG. 6, the bank enable signal BEN is output with a delay by an on-state of the clocked inverter 147 when the delayed refresh enable signal REND is being active with logic "1", while output without a delay by an on-state of the transfer gate 146 when the delayed refresh enable signal REND is being inactive.

Figure 8:
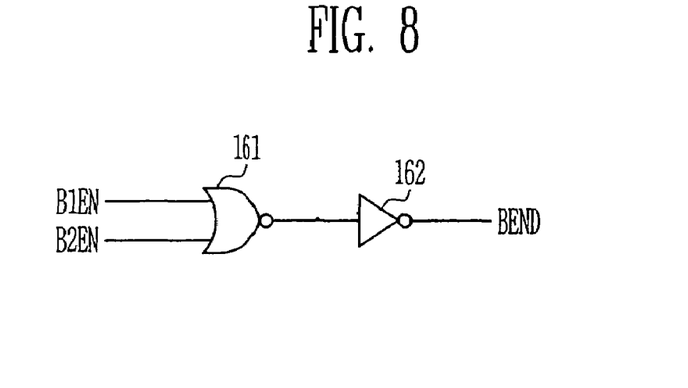
FIG. 8 is a circuit diagram illustrating an embodiment of a second delay unit.

FIG. 8 illustrates an embodiment of the second delay unit. In FIG. 8, the second delay unit outputs the delayed bank enable signal BEND in response to the first bank enable signal B1EN and the second bank enable signal B2EN. The second delay unit conducts an OR operation with a NOR gate 161 and an inverter 162.

Figure 9:
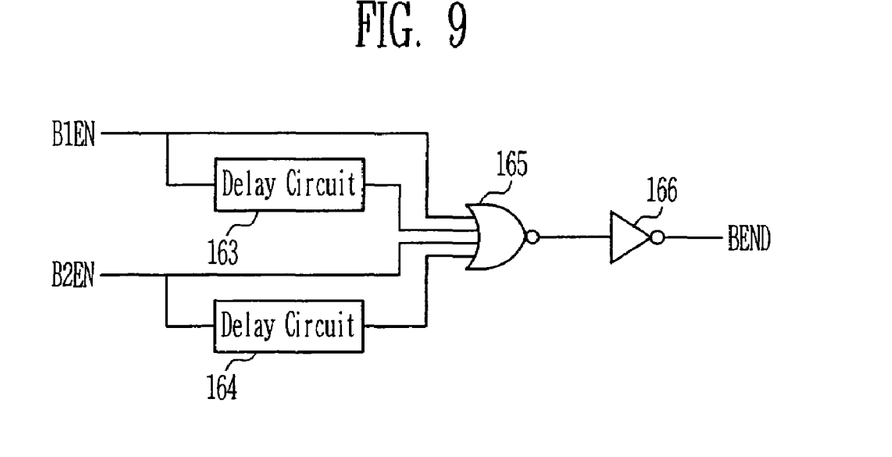
FIG. 9 is a circuit diagram illustrating another embodiment of the second delay unit.

Another embodiment of the second delay unit is illustrated in FIG. 9. In FIG. 9, the second delay unit is constructed of two delay circuits, 163 and 164, one 4-input NOR gate 165, and one inverter 166. With such a structure, the delayed bank enable signal BEND becomes logic "1" when at least one of the first bank enable signal B1EN, the second bank enable signal B2EN, and delayed signals of the bank enable signals is logic "1".

Figure 10:
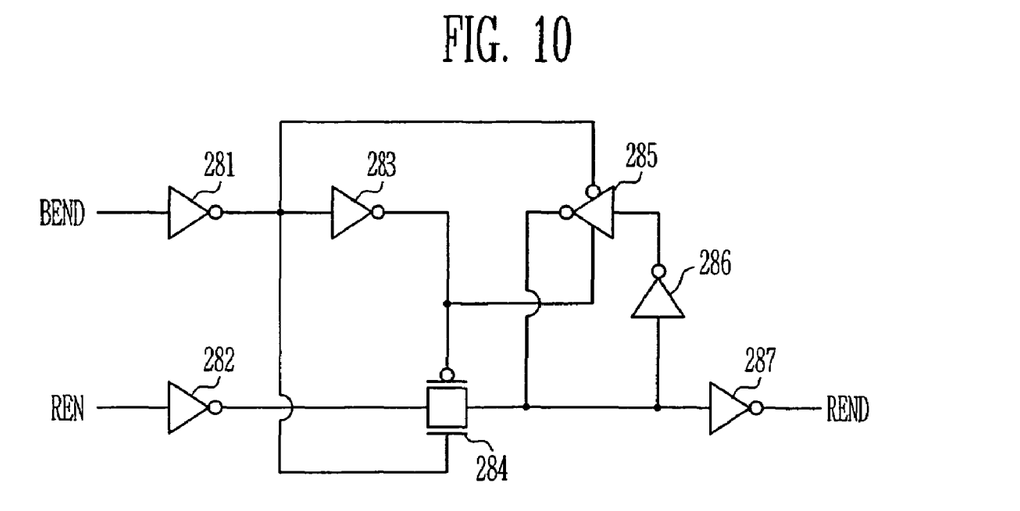
FIG. 10 is a circuit diagram illustrating an embodiment of a latch.

FIG. 10 illustrates an embodiment of the latch in the condition of that an enable state is logic "1". In FIG. 10, the latch outputs the delayed refresh enable signal REND in response to the delayed bank enable signal BEND and the refresh enable signal REN. The latch is composed of five inverters, 281, 282, 283, 286, and 287, one transfer gate 284, and one clocked inverter 285. The refresh enable signal REN is output when the transfer gate 284 is turned on and the clocked inverter 285 is turned off because the delayed bank enable signal BEND is inactive with logic "0". When the delayed bank enable signal BEND is active with logic "1", the clocked inverter 285 becomes an on-state to maintains its previous output because the transfer gate 284 is turned off.

The refresh controller according to the present invention lowers the levels of peak currents by differentiating active times of a first bank enable signal and a second bank enable signal.

The present invention has an advantage that there is no problem of substantially reducing a refresh prosecution time for a second portion because a delayed refresh enable signal is being disabled even while the second bank enable signal is being enabled.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A refresh controller comprising a first element, a second element, and a third element, and outputting a first bank enable signal, a second bank enable signal, and a delayed refresh enable signal in response to a bank enable signal and a refresh enable signal, comprising:
   a first delay unit for outputting a second bank enable signal by delaying a first bank enable signal when a delayed refresh enable signal is active and outputting the bank enable signal as the second bank enable signal when the delayed refresh enable signal is inactive;
   a second delay unit for allowing a delayed bank enable signal to be in an enable state when the first bank enable signal or the second bank enable signal is active and allowing the delayed bank enable signal to be in a disable state when the first and second bank enable signals are inactive; and
   a latch for outputting the delayed refresh enable signal using a refresh enable signal when the delayed bank enable signal is inactive and maintaining a logical state of the delayed refresh enable signal outputted when the delayed bank enable signal is active.

2. The refresh controller of claim 1, wherein the first delay unit includes:
   a delay circuit for delaying the bank enable signal; and
   a multiplexer for outputting an output signal of the delay circuit as the second band enable signal when the delayed refresh enable signal is active and for outputting the first bank enable signal as the second bank enable signal as it is when the delayed refresh enable signal is inactive.

3. The refresh controller of claim 2, wherein the delay circuit includes even number of inverters connected in series.

4. The refresh controller of claim 1, the first delay unit includes:
   a first inverter for inverting the bank enable signal;
   a second inverter for inverting the delayed refresh enable signal;
   a delay circuit for delaying the first bank enable signal;
   a transfer gate for transferring an output signal of the first inverter in response to the delayed refresh enable signal and an output signal of the second inverter;
   a clocked inverter for inverting an output signal of the delay circuit in response to the delayed refresh enable signal and an output signal of the second inverter; and a forth inverter for inverting an output of the transfer gate and the clocked inverter and outputting the second bank enable signal, wherein the clocked inverter is operated when the transfer gate is not operated and the transfer gate is operated when the clocked inverter is not operated.

5. The refresh controller of claim 4, wherein the clocked inverter comprises
 a first PMOS transistor connected to a high voltage source and having a gate connected to a second input terminal;
 a second PMOS transistor connected between the first PMOS transistor and an output terminal and having a gate connected to a first input terminal;
 a first NMOS transistor connected to the output terminal and having a gate connected to the first input terminal; and
 a second NMOS transistor connected between the first NMOS transistor and a low voltage source and having a gate connected to a third input terminal.

6. The refresh controller of claim 1, wherein the second delay unit includes:
 a NOR gate receiving the first bank enable signal and the second bank enable signal; and
 an inverter for inverting an output signal of the NOR gate and outputting the delayed bank enable signal.

7. The refresh controller of claim 1, wherein the latch includes:
 a first inverter for inverting the delayed bank enable signal;
 a second inverter for inverting an output signal of the first inverter;
 a third inverter for inverting the refresh enable signal;
 a transfer gate for transferring an output signal of the third inverter in response to output signals of the first and second inverters;
 a forth inverter for inverting an output signal of the transfer gate;
 a clocked inverter for inverting an output signal of the forth inverter in response to output signals of the first and second inverters; and
 a fifth inverter for inverting the output signal of the transfer gate and outputting the delayed refresh enable signal,
 wherein the clocked inverter is operated when the transfer gate is not operated and the transfer gate is operated when the clocked inverter is not operated.

8. The refresh controller of claim 1, further comprising a buffer for increasing a drivability of the first bank enable signal.

9. The refresh controller of claim 1, wherein the second delay unit includes:
 a first delay circuit for delaying the first bank enable signal;
 a second delay circuit fur delaying the second bank enable signal;
 a four-input NOR gate for logical operating in response to output signals of the first and second delay circuit, the first bank enable signal and the second bank enable signal; and
 an inverter for inverting an output signal of the four-input NOR gate and outputting the delayed bank enable signal.

10. The refresh controller of claim 9, wherein the first delay circuit includes even number of inverters connected in series.

11. The refresh controller of claim 9, wherein the second delay circuit includes even number of inverters connected in series.

12. A refresh controller, comprising:
 a first delay unit for outputting a second bank enable signal by delaying a bank enable signal inputted or outputting to first bank enable signal as the second bank enable signal as it is, in response to a delayed refresh enable signal;
 a second delay unit for outputting a delayed bank enable signal in response to a logical state of the first and second bank enable signals; and
 a latch for outputting the delayed refresh enable signal using a refresh enable signal or maintaining a logical state of the delayed refresh enable signal outputted regardless of the refresh enable signal, in response to the delayed bank enable signal.

13. The refresh controller of claim 12, wherein the second delay unit outputs the delayed bank enable signal having an enable state when the first bank enable signal or the second bank enable signal is being active and outputs the delayed bank enable signal having an disable signal after the first and second bank enable signals are being inactive.

* * * * *

UNITED STATES PATENT AND TRADEMARK OFFICE
CERTIFICATE OF CORRECTION

PATENT NO. : 7,031,216 B2  Page 1 of 1
APPLICATION NO. : 10/874568
DATED : April 18, 2006
INVENTOR(S) : Min Y. You It is certified that error appears in the above-identified patent and that said Letters Patent is hereby corrected as shown below:

In the Claims:

Column 6, line 28, "a first bank" should be -- a bank --.

Column 6, line 49, "the first bank" should be -- the bank --.

Column 6, line 61, "the first bank" should be -- the bank --.

Column 7, line 8, "comprises" should be -- comprises; --.

Column 8, line 8, "fur" should be -- for --.

Column 8, line 27, "to first bank" should be -- the bank --.

Signed and Sealed this

Seventeenth Day of April, 2007

JON W. DUDAS
*Director of the United States Patent and Trademark Office*